United States Patent
Miyano et al.

(10) Patent No.: US 8,082,124 B2
(45) Date of Patent: Dec. 20, 2011

(54) METHOD AND SYSTEM FOR DIAGNOSING ABNORMAL PLASMA DISCHARGE

(75) Inventors: Takaya Miyano, Shiga (JP); Toshiyuki Matsumoto, Hyogo (JP); Naoki Ikeuchi, Hyogo (JP); Tsuyoshi Moriya, Yamanashi (JP)

(73) Assignees: Ritsumeikan University, Tokyo (JP); Tokyo Electron Ltd., Tokyo (JP)

( * ) Notice: Subject to any disclaimer, the term of this patent is extended or adjusted under 35 U.S.C. 154(b) by 252 days.

(21) Appl. No.: 12/089,664

(22) PCT Filed: Jul. 2, 2007

(86) PCT No.: PCT/JP2007/063254
§ 371 (c)(1),
(2), (4) Date: Apr. 9, 2008

(87) PCT Pub. No.: WO2008/004528
PCT Pub. Date: Jan. 10, 2008

(65) Prior Publication Data
US 2010/0161278 A1    Jun. 24, 2010

(30) Foreign Application Priority Data
Jul. 3, 2006    (JP) .................................. 2006-183886

(51) Int. Cl.
*G06F 11/30* (2006.01)
(52) U.S. Cl. .......................... 702/183; 702/179; 702/189
(58) Field of Classification Search .................. 702/179, 702/183, 189; 438/5, 14; 356/316; 216/59, 216/67
See application file for complete search history.

(56) References Cited

U.S. PATENT DOCUMENTS

| | | | |
|---|---|---|---|
| 6,761,771 B2 * | 7/2004 | Satoh et al. | 118/725 |
| 7,115,210 B2 * | 10/2006 | Calderoni et al. | 216/59 |
| 7,257,457 B2 * | 8/2007 | Imai et al. | 700/121 |
| 2004/0173319 A1 * | 9/2004 | Suzuki et al. | 156/345.51 |
| 2006/0275931 A1 * | 12/2006 | Takizawa et al. | 438/5 |

FOREIGN PATENT DOCUMENTS

| | | |
|---|---|---|
| JP | 3031376 B | 5/1991 |
| JP | 2001-066194 | 3/2001 |
| JP | 2002-168699 | 6/2002 |
| JP | 2003-273009 | 12/2002 |
| JP | 2003-100714 | 4/2003 |
| JP | 2003-173896 | 6/2003 |
| JP | 2004-134723 | 4/2004 |
| JP | 2006-128304 | 5/2006 |
| JP | 2006-140440 | 6/2006 |
| WO | WO2004-051713 | 6/2004 |

* cited by examiner

*Primary Examiner* — Mohamed Charioui
*Assistant Examiner* — Elias Desta
(74) *Attorney, Agent, or Firm* — Finnegan, Henderson, Farabow, Garret & Dunner, LLP

(57) ABSTRACT

Provided are a data obtaining section (21) that obtains a time-series data fluctuating in accordance with the plasma conditions, a translation error calculation section (24) that calculates a determinism providing an indicator of whether the time-series data in the plasma are deterministic or stochastic, from the time-series data that have been obtained in the data obtaining unit (21), and an abnormal discharge determination section (26) that determines that the plasma is under the abnormal discharge conditions, in the case that the value representing the determinism calculated in the determinism derivation unit is less than or equal to a given threshold value, during the plasma generation. Examples of the value representing the determinism include translation error or permutation entropy. In the case the permutation entropy is used as a value representing the determinism, a permutation entropy calculation section is provided.

15 Claims, 8 Drawing Sheets

PERMUTATION ENTROPY COMPARISON

METHOD AND SYSTEM FOR DIAGNOSING ABNORMAL PLASMA DISCHARGE

TECHNICAL FIELD

The present invention relates to a method for diagnosing abnormal plasma discharge, an abnormal plasma discharge diagnostics system, and a computer program.

BACKGROUND ART

Plasma processing apparatuses are in practical use. A plasma processing apparatus uses plasma to perform varying processes, including forming a thin film, edging, and reforming a substrate for e.g. a semiconductor wafer, a flat-panel display, and so forth. A typical operation performed by such apparatus is to introduce processing gas into the chamber, then apply a high-frequency electric power to the processing gas inside the chamber to produce plasma, and process substrate with the plasma. Since plasma is unstable, a difficulty is encountered in a measurement to grasp in what condition the plasma is—among others, in such processes as treat various elements, like processes in semiconductor manufacturing.

Where the high-frequency electricity is applied inside a chamber in a plasma processing apparatus, abnormal discharges, exemplified by an electric arch, may be caused due to various factors. Such abnormal discharge causes damage to the substrate and components disposed inside the chamber. The damage is, more specifically, cracks, notches, or the like caused on the surface of a semiconductor wafer configured for use as a substrate of microcircuit, or burning-out of components. The abnormal plasma discharge also causes detach of deposits stuck to a component inside the chamber, such as an upper electrode, and produces particles inside the chamber.

Earlier detection of abnormal discharge and subsequent stopping of the operation are required in the plasma processing apparatus, in order to preclude damage to the semiconductor wafer and the components, and preclude the production of particles which the abnormal plasma discharge would cause. For readily detecting the abnormal discharge, several methods are conventionally proposed: one is by monitoring a current value supplied from a power-feeding rod connected to an electrode inside the chamber, and another is by monitoring reflected waves of a high-frequency voltage reflected from such electrode. However, either of the above is of poor sensitivity and, among others, incapable of detecting minimal abnormal discharge.

Thus, a method of detecting a phenomenon of AE (Acoustic Emission) occurring during the abnormal discharge has been developed in recent years. In this method, an ultrasonic sensor is used to detect ultrasonic waves based on the emission of energy during the abnormal discharge.

Unexamined Japanese Patent Application KOKAI Publication No. 2003-100714 (hereinafter referred to as Patent Literature 1) describes examples of apparatuses that use the aforementioned method. One of these is a device that is equipped with a plurality of ultrasonic sensors disposed on an outside wall of the chamber and configured to detect ultrasonic waves caused by emission of energy during abnormal discharge by using such sensors, and another is a device that is equipped with a plurality of acoustic probes which are disposed in contact with a susceptor used as a mounting table on which a semiconductor wafer is mounted or with a focus ring disposed in the vicinity of the mounted semiconductor wafer, and an ultrasonic detector that detects ultrasonic waves propagated from the such acoustic probes, to thereby detect the above-mentioned ultrasonic waves.

The ultrasonic sensors detect as signals not only ultrasonic waves caused by the emission of energy during abnormal discharge, but also noise caused by a mechanical vibration due to opening/closing of a gate valve of the plasma processing apparatus. Therefore, it is necessary to distinguish which of ultrasonic waves caused by the abnormal discharge and the noise due to mechanical vibration, the ultrasonic sensors have detected.

As an art to detect the abnormal plasma discharge, for example, a device disclosed in Unexamined Japanese Patent Application KOKAI Publication No. 2003-173896 (hereinafter referred to as Patent Literature 2), comprises acoustic sensors provided in the plasma processing apparatus, and a processing unit of the abnormal discharge detecting device of the plasma processing apparatus comprising at least of a processing unit that processes the detection output of the ultrasonic waves conducted by the ultrasonic sensors to detect the abnormal discharge, which includes at least 2 filters of a first filter relatively transmitting only signals on low-frequency and a second filter relatively transmitting only signals on high-frequency.

Additionally, a device disclosed in Unexamined Japanese Patent Application KOKAI Publication No. 2006-128304 (hereinafter referred to as Patent Literature 3) comprises acoustic sensors and potential probes in the plasma processing apparatus, and detects a potential variation on the potential probes, and further detects the ultrasonic waves in the ultrasonic sensors. If it is judged that the ultrasonic waves are detected at the same timing as the potential variation is detected, it will be judged that the abnormal discharge has occurred.

Since the frequency distributions were expected to differ for ultrasonic waves caused by abnormal discharge and for noise due to mechanical vibration, to distinguish between the noise and the ultrasonic waves, it was thought effective to analyze the frequencies of the signals detected by the ultrasonic sensors.

However, as with the Patent Literature 2, in a method that enters time-series data in different band filters and detects the difference of that data by using a ratio of the maximum amplitude for each filter output, the abnormal plasma discharge is not identifiable in the case that the ultrasonic waves caused by abnormal discharge have the same frequency band and amplitude as the sound waves caused by opening/closing valves or as the sound waves in the vicinity of the device.

Experiments conducted by the inventors of the present invention in recent years has proved that the frequency distribution of the ultrasonic waves caused by the abnormal discharge changes according to the position in the plasma processing apparatus where abnormal discharge occurs. In addition, expected is that the frequency distribution of ultrasonic waves caused by abnormal discharge will differ between individual plasma processing apparatuses.

Additionally, in respect of time-series data of the ultrasonic sensors provided in the plasma processing apparatus, an establishment density and a power spectrum may be the same under both of the normal plasma conditions and the abnormal discharge conditions. Thus, the abnormal discharge is not identifiable in conventional methods, because there may be no characteristic difference in the power spectrum even if the frequency power spectrum is estimated and the spectrum shape is compared under the normal conditions and under the abnormal discharge conditions. Thus, the conventional time-series data analysis may not often show the difference between the time-series data clearly and quantitatively.

DISCLOSURE OF INVENTION

The present invention has been developed considering the above-mentioned situations, and the objective thereof is to provide a highly accurate method of diagnosing abnormal plasma discharge and abnormal plasma discharge diagnostics system, without the need to comprise multiple sensors in a plasma processing apparatus.

A method for diagnosing abnormal plasma discharge according to the first aspect of the present invention includes:

a data obtaining step adapted to cause a data obtaining section to obtain time-series data that fluctuate in accordance with the plasma conditions;

a determinism derivation step adapted to cause a derivation section to derive a value representing a determinism providing an indicator of whether the time-series data in the plasma are deterministic or stochastic, from the time-series data that have been obtained in the data obtaining step; and an abnormal discharge determination step adapted to cause an abnormal discharge determination section to determine that the plasma is under abnormal discharge conditions, in the case that the value representing the determinism derived in the determinism derivation step is less than or equal to a given threshold value, during plasma generation.

In particular, the value representing the determinism is a translation error that is calculated from the time-series data, and the determinism derivation step is characterized by including:

an embedding step adapted to cause an embedding vector generation section to calculate embedding vectors having a certain dimension from the time-series data;

a nearest-neighbor vector extraction step adapted to cause a neighbor vector extraction section to extract a given number of the nearest-neighbor vectors in respect of a certain embedding vector, out of the embedding vectors that have been calculated in the embedding step, and a translation error calculation step adapted to cause a translation error calculation section to calculate a translation error that is the dispersion of a given number of nearest-neighbor vectors that have been extracted in the nearest-neighbor vector extraction step, and in the abnormal discharge determination step, the abnormal discharge determination section determines that the plasma is under abnormal discharge conditions, in the case that the translation error calculated in the translation error calculation step is less than or equal to the given threshold value, during plasma generation.

Alternatively, the value representing the determinism may be permutation entropy that is calculated from the time-series data, and the determinism derivation step may include:

an embedding step adapted to cause an embedding vector generation section to calculate embedding vectors having a certain dimension from the time-series data;

a realization frequency calculation step adapted to cause, in respect of all the embedding vectors calculated from the time-series data in the given time that have been calculated in the embedding step, a realization frequency calculation section to accumulate the frequency having the same order determined by a magnitude relation for elements of the embedding vectors, and calculates a relative realization frequency against the number of all the embedding vectors calculated from the time-series data in the given time; and a permutation entropy calculation step adapted to cause a permutation entropy calculation section calculates permutation entropy which is defined that all the permutation made up of the same number of orders as the number of the dimensions of the embedding vector are to be a stochastic variable, and that the relative realization frequency calculated in the realization frequency calculation step is to be a stochastic distribution, and in the abnormal discharge determination step, the abnormal discharge determination section determines that the plasma is under the abnormal discharge conditions, in the case that the permutation entropy calculated in the permutation entropy calculation step is less than or equal to the given threshold value, during the plasma generation.

The time-series data that fluctuates in accordance with the plasma conditions may include at least one of the time-series data from an AE (Acoustic Emission) sensor, a pressure sensor, a temperature sensor, a particle sensor, a current sensor, a voltage sensor, an ultrasonic sensor, a gas analyzer, a vibration sensor, an optical emission sensor, an electromagnetic wave sensor, or a plasma sensor comprised of a Langmuir probe or a plasma absorption probe.

Preferably, the dimension of the embedding vector is characterized to be more than or equal to 6.

Additionally, the configuration may be as follows:

the nearest-neighbor vector extraction step extracts more than or equal to 4 nearest-neighbor vectors, in respect of the certain embedding vector;

the translation error calculation step calculates a translation error estimated in a time evolution step made up of 5 steps in respect of tracks up to the fourth proximity; and the abnormal discharge determination step determines that the plasma is under the abnormal discharge conditions, in the case that the translation error estimated in the time evolution step made up of 5 steps is less than or equal to 0.1, in respect of the tracks up to the fourth proximity and during plasma generation.

Preferably, the configuration may be as follows:

the permutation entropy calculation step calculates permutation entropy that is normalized such that the permutation entropy under a full random process is an upper value; and the abnormal discharge determination step determines that the plasma is under the abnormal discharge conditions, in the case that the normalized permutation entropy is less than or equal to 0.8, and during plasma generation.

A method for diagnosing abnormal plasma discharge according to the second aspect of the present invention comprises:

a data obtaining unit adapted to cause a data obtaining section to obtain a time-series data that fluctuates in accordance with the plasma conditions;

a determinism derivation unit adapted to cause a derivation section to derive a value representing a determinism providing an indicator of whether the time-series data in the plasma is deterministic or stochastic, from the time-series data that have been obtained by the data obtaining unit; and an abnormal discharge determination unit adapted to cause an abnormal discharge determination section to determine that the plasma is under abnormal discharge conditions, in the case that the value representing the determinism derived in the determinism derivation unit is less than or equal to a given threshold value, during plasma generation.

In particular, the value representing the determinism is a translation error that is calculated from the time-series data, and the determinism derivation unit is characterized by including:

an embedding unit adapted to cause an embedding vector generation section to calculate embedding vectors having a certain dimension from the time-series data;

a nearest-neighbor vector extraction unit adapted to cause a neighbor vector extraction section to extract a given number of the nearest-neighbor vectors in respect of a certain embedding vector, out of the embedding vectors that have been calculated in the embedding unit; and a translation error calculation unit adapted to cause a translation error calculation section to calculate a translation error that is the dispersion of a given number of nearest-neighbor vectors that have been extracted in the nearest-neighbor vector extraction unit, wherein the abnormal discharge determination unit is characterized that the abnormal discharge determination section determines that the plasma is under abnormal discharge conditions, in the case that the translation error calculated in the translation error calculation unit is less than or equal to the given threshold value, during plasma generation.

Alternatively, the value representing the determinism may be permutation entropy that is calculated from the time-series data, and the determinism derivation unit may include:

an embedding unit adapted to cause an embedding vector generation section to calculate embedding vectors having a certain dimension from the time-series data;

a realization frequency calculation unit adapted to cause, in respect of all the embedding vectors calculated from the time-series data in the given time that have been calculated in the embedding unit, a realization frequency calculation section to accumulate the frequency having the same order determined by a magnitude relation for elements of the embedding vectors, and calculates a relative realization frequency against the number of all the embedding vectors calculated from the time-series data in the given time; and a permutation entropy calculation unit adapted to cause a permutation entropy calculation section calculates permutation entropy, in which all the permutation made up of the same number of orders as the number of the dimensions of the embedding vector are to be a stochastic variable, and the relative realization frequency calculated in the realization frequency calculation unit is to be a stochastic distribution, wherein the abnormal discharge determination unit determines that the plasma is under abnormal discharge conditions, in the case that the permutation entropy calculated in the permutation entropy calculation step is less than or equal to the given threshold value, during plasma generation.

The time-series data that fluctuate in accordance with the plasma conditions may include at least one of the time-series data from an AE (Acoustic Emission) sensor, a pressure sensor, a temperature sensor, a particle sensor, a current sensor, a voltage sensor, an ultrasonic sensor, a gas analyzer, a vibration sensor, an optical emission sensor, an electromagnetic wave sensor, or a plasma sensor comprised of a Langmuir probe or a plasma absorption probe.

Preferably, the dimension of the embedding vector is characterized to be more than or equal to 6.

Additionally, the configuration may be as follows:

the nearest-neighbor vector extraction unit extracts more than or equal to 4 nearest-neighbor vectors, in respect of a certain embedding vector;

the translation error calculation unit calculates a translation error estimated in a time evolution step made up of 5 steps in respect of tracks up to the fourth proximity; and the abnormal discharge determination step determines that the plasma is under the abnormal discharge conditions, in the case that the translation error estimated in the time evolution step made up of 5 steps is less than or equal to 0.1, in respect of the tracks up to the fourth proximity and during the plasma generation.

Preferably, the configuration may be as follows:

the permutation entropy calculation unit calculates permutation entropy that is normalized such that the permutation entropy under a full random process is an upper value, and the abnormal discharge determination unit determines that the plasma is under the abnormal discharge conditions, in the case that the normalized permutation entropy is less than or equal to 0.8, and during the plasma generation.

A computer program according to the third aspect of the present invention may cause a computer to function as the following units in order to diagnose abnormal plasma discharge:

a data obtaining unit adapted to cause a data obtaining section to obtain a time-series data that fluctuates in accordance with the plasma conditions;

a determinism derivation unit adapted to cause a derivation section to derive a value representing a determinism providing an indicator of whether the time-series data in the plasma is deterministic or stochastic, from the time-series data that have been obtained in the data obtaining unit; and an abnormal discharge determination unit adapted to cause an abnormal discharge determination section to determine that the plasma is under the abnormal discharge conditions, in the case that the value representing the determinism derived in the determinism derivation unit is less than or equal to a given threshold value, during the plasma generation.

EFFECTS OF THE INVENTION

A method for diagnosing abnormal plasma discharge and an abnormal plasma discharge diagnostics system of the present invention, make it possible to represent the difference of time-series data between the cases of the plasma under normal conditions and under abnormal discharge conditions, by quantifying a deterministic structure behind the time-series data and by reconstructing tracks in a phase space from the time-series data by a time-delay coordinate transformation, even though the time-series data are different, but a power spectrum has apparently the same data values. Further, the present invention can conduct a high accurate abnormal plasma discharge diagnosis by using relatively small number of data. Additionally the present invention is not necessary to provide multiple sensors to each equipment.

BRIEF DESCRIPTION OF DRAWINGS

These objects and other objects and advantages of the present invention will become more apparent upon reading of the following detailed description and the accompanying drawings in which.

REFERENCE NUMBERS

Figure 1:
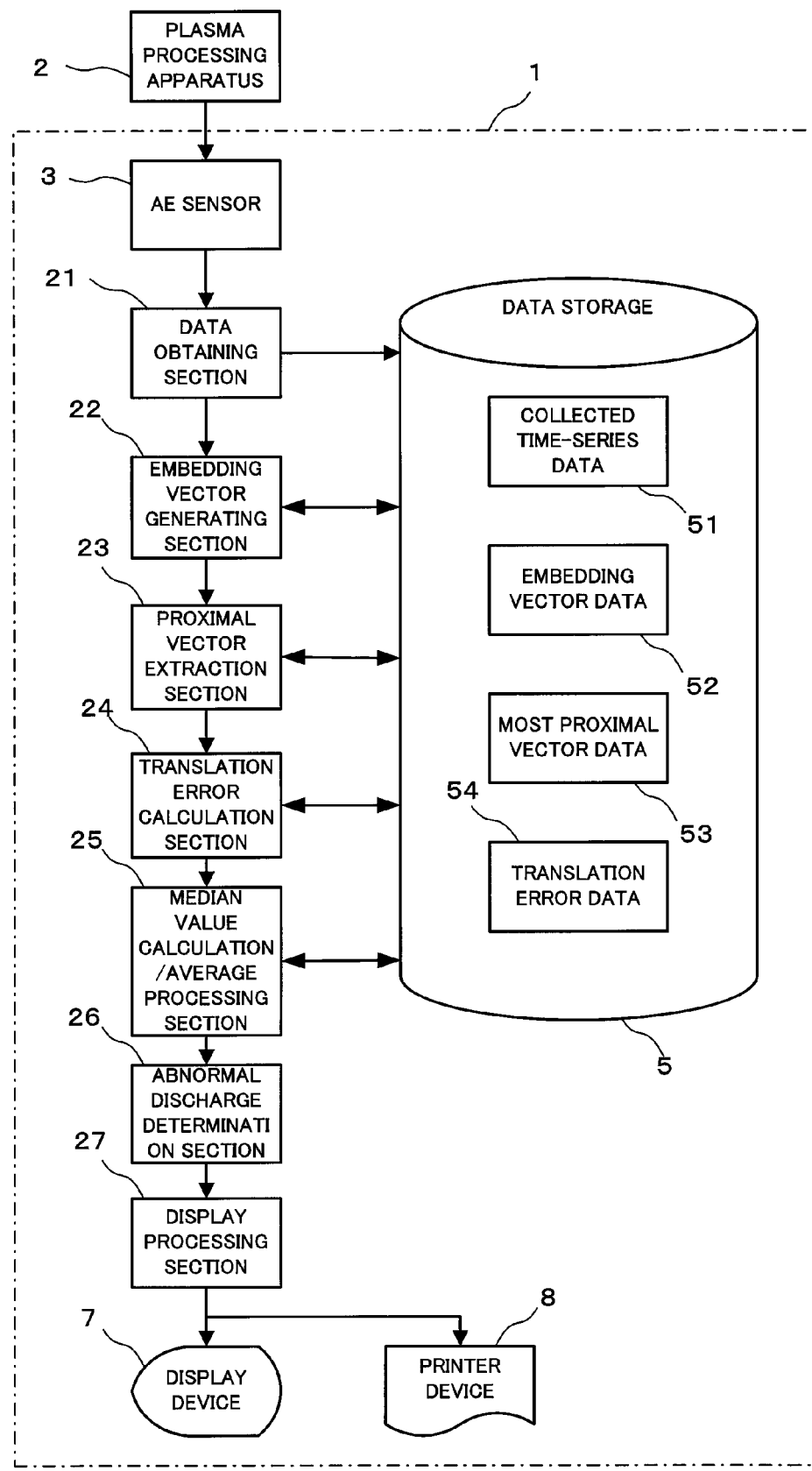
FIG. 1 is a block diagram showing a logical configuration of an abnormal plasma discharge diagnostics system, according to the first embodiment of the present invention.

1: Abnormal plasma discharge diagnostics system
2: Plasma processing apparatus
3: AE sensor
5: Data storage
7: Display device
8: Printer device
10: Internal bus
11: Control section
12: Main memory
13: External memory
14: Operation section
15: Screen display
16: Print output section
17: Sending/receiving section
21: Data obtaining section
22: Embedding vector generation section
23: Neighbor vector extraction section
24: Translation error calculation section
25: Median value calculation/average processing section
26: Abnormal discharge determination section
27: Display processing section
28: Realization frequency calculation section
29: Permutation entropy calculation section
30: Average processing section
41: Chamber
42: High-frequency power source
43: Matching box
44: Processing gas conduit
45: Power-feeding rod
51: Collected time-series data
52: Embedding vector data
53: Nearest-neighbor vector data
54: Translation error data
55: Permutation realization frequency data
56: Permutation entropy data

BEST MODE FOR CARRYING OUT THE INVENTION

Embodiment 1

Embodiments of the present invention will be described in detail below with reference to the drawings. It should be noted that the same and equivalent parts have the same code in the figures, and the explanations thereof are not repeated. An abnormal plasma discharge diagnostics system intended for a diagnosis of a plasma processing apparatus such as a semiconductor manufacturing device is exemplified and described below.

FIG. 1 is a block diagram showing a logical configuration of an abnormal plasma discharge diagnostics system 1, according to the first embodiment of the present invention. The abnormal plasma discharge diagnostics system 1 is comprised of an AE (Acoustic Emission) sensor 3, a data obtaining section 21, an embedding vector generation section 22, a neighbor vector extraction section 23, a translation error calculation section 24, a median value calculation/average processing section 25, a data storage 5, an abnormal discharge determination section 26, a display processing section 27, a display device 7, and a printer device 8, etc. In this figure, the embedding vector generation section 22, the neighbor vector extraction section 23, the translation error calculation section 24 and the median value calculation/average processing section 25, are combined to be a derivation section. Collected time-series data 51, embedding vector data 52, the nearest-neighbor vector data 53, and translation error data 54, which show the equipment conditions intended for the abnormal plasma discharge diagnosis, are stored in the data storage 5. The plasma abnormal discharging diagnostics system 1 diagnoses if the plasma causes an abnormal discharge in the plasma processing apparatus 2.

Hereinafter, the translation error will be described as an indicator representing the determinism. If time-series analysis algorism of Wayland et al. (R. Wayland, D. Bromley, D. Pickett, and A. Passamante, Physical Review Letters, Vol. 70, pp. 580-582, 1993), is employed, it is quantitatively assessed on how many deterministic aspects are recognized.

An embedding vector of r $(ti)=\{r (ti), r (ti-\Delta t), \ldots, r (ti-(n-1)\Delta t)\}^T$ at a certain time ti, is generated from a time-series data of $\{r (ti)\}$ $(i=0, \ldots, N-1)$. The superscript $T$ represents a transposed matrix. n represents an appropriate embedding dimension. $\Delta t$ represents, for example, an appropriate time difference selected from mutual information.

The number K of the nearest-neighbor vectors, in respect of certain embedding vectors $r (t_o)$ are extracted from an embedding vector set. The distance between the vectors is measured by the Euclidean distance technique. The number K of the nearest-neighbor vectors is represented as r (tj) $(j=0, \ldots, K)$. For each of r (tj), vectors after the time passage of $T\Delta t$, are to be r $(tj+T\Delta t)$. At this stage, the track change of the embedding vectors according to the time passage (time evolution step) $T\Delta t$ is approximately represented by $$v(tj)=r(tj+T\Delta t)-r(tj) \quad (1)$$

If the status of the time evolution is deterministically recognized, the part that is proximal to each track group of the neighbor vectors will be shifted to the part that is proximal after $T\Delta t$ has passed. Thus, the dispersion in the direction of v (tj) will be an indicator of assessing how deterministic the observed time evolution is recognized. The dispersion in the direction of v (tj) is represented by the following formula:

[Equation 1]

$$E_{trans} = \frac{1}{K+1}\sum_{j=0}^{K}\frac{\|v(tj)-\bar{v}\|}{\|\bar{v}\|} \quad (2)$$

$$\bar{v} = \frac{1}{K+1}\sum_{j=0}^{K}v(tj) \quad (3)$$

E trans is called as a translation error. In order to suppress E trans error caused by the selection of r $(t_o)$, the operation that calculates the median value for the number M of r $(t_o)$ that have been selected randomly, is repeated for the number Q of times, and E trans is assessed by the average of the number Q of the median values. As the deterministic aspect of the time-series data increases, E trans will approach 0. If the time-series data is a white noise, E trans used as the median value will be proximal to 1, since a difference vector v (tj) is homogeneously and isotropically distributed. If the time-series data is a stochastic process having a strong linear correlation, E trans will be below 1, since the direction of the neighbor track group becomes partially the same direction as a result of autocorrelation.

The numerical experiment shows E trans>0.5. In the range of 0.1<E trans<0.5, the time-series data may be stochastic time-series, or deterministic time-series that is contaminated by an observation noise. In the case of E trans<0.1, it is not possible to explain that the time-series data is stochastic time-series, and it is fully recognized that it is deterministic time-series.

This embodiment diagnoses the conditions of the abnormal plasma discharge, using the fact that the error translation, E trans becomes an indicator representing the determinism of the time-series data showing the plasma conditions. The time-series data of the AE sensor under the normal plasma conditions, irregularly fluctuates in accordance with various disturbances, which is considered to be stochastic. In the case that the plasma is under abnormal discharge conditions, the time-series data is considered to be deterministic, since the acoustic emission is controlled by abnormal discharge. Thus, when the translation error, E trans, is a small value that is less than or equal to a given threshold value, it is determined that the plasma is under abnormal discharge conditions.

Returning to FIG. 1, the function of each section in the abnormal plasma discharge diagnostics system 1, will be described. The data obtaining section 21 collects the time-series data showing the conditions of the equipment intended for the diagnosis, and the data is memorized as collected time-series data 51 in a data storage 5. Examples as time-series data, other than the data from an AE sensor, include data from a pressure sensor, a temperature sensor, a particle sensor, a current sensor, a voltage sensor, an ultrasonic sensor, a gas analyzer, a vibration sensor, an optical emission sensor, an electromagnetic wave sensor, or a plasma sensor, etc. A plasma sensor is comprised of, for example, a Langmuir probe or a plasma absorption probe. It is possible that the value detected by theses sensors will vary when the plasma is under abnormal discharge conditions. The time-series data showing the plasma conditions are entered from various sensors (not shown) by sampling in an appropriate cycle.

The embedding vector generation section 22 generates the above-mentioned embedding vector r (ti), from the collected time-series data 51. The dimension n and the time difference $\Delta t$ of the embedding vector, are predetermined according to the characteristics of the time-series data. The embedding vector generation section 22 enables the set of the generated embedding vectors to be memorized in the data storage 5 (embedding vector data 52).

The neighbor vector extraction section 23 selects arbitrary embedding vectors r ($t_o$) from the set of the embedding vectors, and extracts the number K of embedding vectors that are nearest-neighbor to the embedding vector r ($t_o$) selected from the set of the embedding vectors (the nearest-neighbor vector) r (tj) (j=0, 1, . . . , K). The neighbor vector extraction section 23 extracts the nearest-neighbor vectors from the number M of embedding vectors that have been randomly selected, and enables the data storage 5 to be memorized (the nearest-neighbor vector data 53). The number K of the nearest-neighbor vector and the number M of the selection are predetermined according to the characteristics of the time-series data in order to suppress the statistical error of the translation error calculation. Further, the neighbor vector extraction section 23 repeats the random selection of the number M of embedding vectors and the extraction of the nearest-neighbor vectors, for the number Q of times.

The translation error calculation section 24 calculates, from the pair of the nearest-neighbor vectors, the translation errors, E trans that is the dispersion in the direction thereof. The translation error calculation section 24 also calculates the translation errors, E trans for the nearest-neighbor vectors of the number M of embedding vectors that have been randomly selected. Additionally, the translation error calculation section 24 calculates the translation errors, E trans for the pair of the nearest-neighbor vectors of the number M of embedding vectors conducted for the number Q of times, and memorizes those values in the data storage 5 (translation error data 54).

The median value calculation/average processing section 25 calculates the median value of the number M of translation errors for each time, and calculates the average of each median value repeated for the number Q of times. The average value of the translation errors is entered into the abnormal discharge determination section 26. The abnormal discharge determination section 26 compares the given threshold value with the average value of the translation errors, and determines that the plasma is under the abnormal discharge conditions if the average value of the translation errors is less than or equal to the threshold value.

A display processing section 27 displays, for example, the average value transition of the translation errors and the determination results of the abnormal plasma discharge in a display device 7. The display processing section 27 also enables the printer device 8 to output for printing at the same time. The display processing section 27 may display the time-series data together with the translation errors. If it is determined that the plasma is under the abnormal discharge conditions, the display processing section 27 may display a warning by means of blinking a light or ringing a buzzer.

Figure 2:
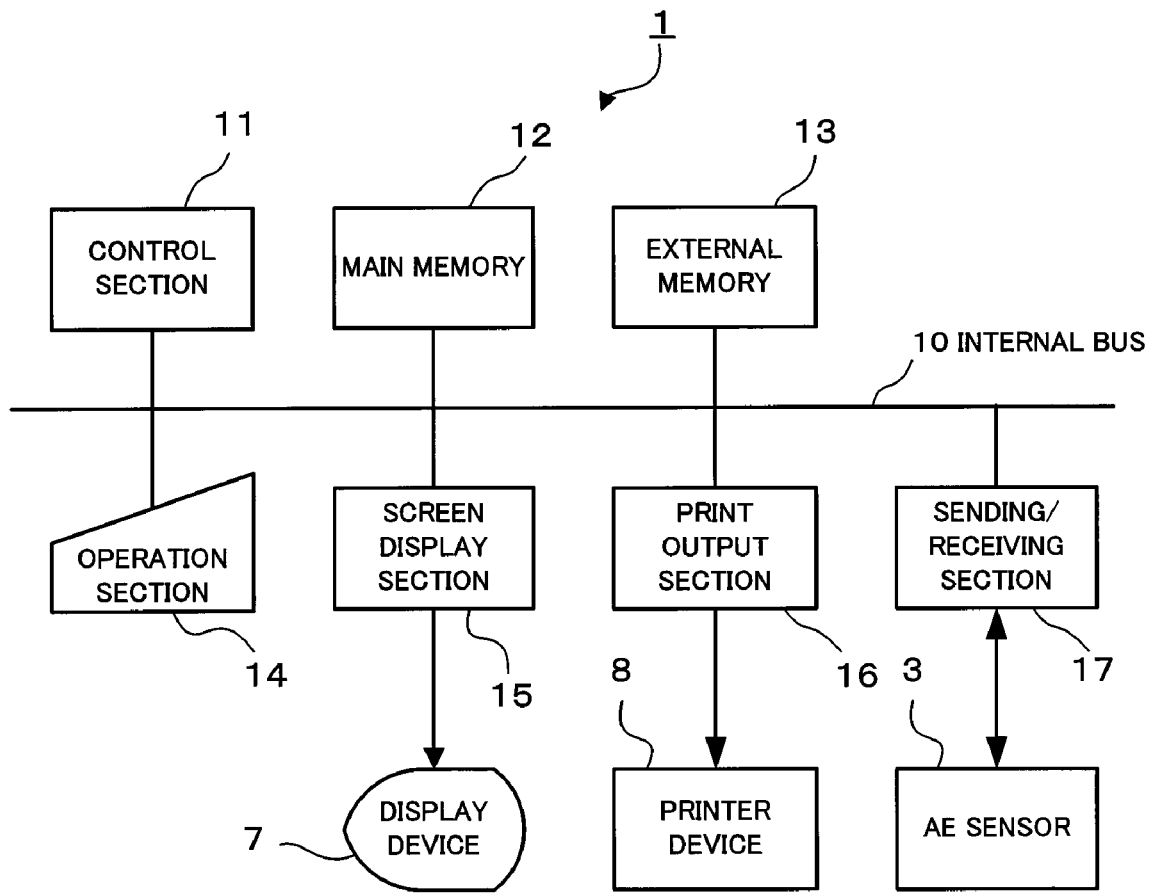
FIG. 2 is a block diagram showing an example of a logical configuration of an abnormal plasma discharge diagnostics system.

FIG. 2 is a block diagram showing an example of a logical configuration of an abnormal plasma discharge diagnostics system 1. The abnormal plasma discharge system 1 shown in FIG. 1, as a hardware, is comprised of a control section 11, a main memory 12, an external memory 13, an operation section 14, a screen display 15, a print output section 16, a sending/receiving section 17, an AE sensor 3, a display device 7, and a printer device 8, as shown in FIG. 2. The control section 11, the main memory 12, the external memory 13, the operation section 14, the screen display 15, the print output section 16, and sending/receiving section 17, are all connected with the control section 11 through the internal bus 10.

The control section 11 is comprised of, for example, a CPU (Central Processing Unit), and executes, according to the programs memorized in the external memory 13, the processes of the data obtaining section 21, the embedding vector generation section 22, the neighbor vector extraction section 23, the translation error calculation section 24, the median value calculation/average processing section 25, the abnormal discharge determination section 26, and the display processing section 27. The data obtaining section 21, the embedding vector generation section 22, the neighbor vector extraction section 23, the translation error calculation section 24, the median value calculation/average processing section 25, the abnormal discharge determination section 26, and the display processing section 27, can be realized by the control section 11 and the programs executed thereon.

The main memory 12 is comprised of, for example, a RAM (Random-Access Memory) and used as a work area of the control section 11. The data storage 5 is stored for memory as a structure of the memory area in a part of the main memory 12.

The external memory 13 is comprised of a nonvolatile memory, such as a flash memory, a hard disc, DVD (Digital Versatile Disc), DVD-RAM (Digital Versatile Disc Random- Access Memory), and DVD-RW (Digital Versatile Disc Re Writable), and memorizes in advance, the programs for causing the control section 11 to perform the such processes. The external memory 13 also supplies the data of this program to the control section 11 in accordance with the instruction from the control section 11, and memorizes the data supplied from the control section 11. For example, in some cases, the time-series data may be stored in the external memory 13.

The operation section 14 comprises pointing devices, such as a key switch, a jog dial, a keyboard, and a mouse, and interface devices that connects them with the internal bus 10, to control the abnormal plasma discharge diagnostics system 1 by operators. The determination conditions of the abnormal plasma discharge, the time-series data, and the commencement instruction of the abnormal plasma discharge diagnosis, are inputted through the operation section 14, and supplied to the control section 11. Other than that, the embedding dimension n, the time difference $\Delta t$, K that is the number of neighbor vectors, M that is the number of the selected of embedding vectors, and Q that is the number of the repeated calculations, etc, are input and set through the operation section 14.

The display device 7 is comprised of, for example, a CRT (Cathode Ray Tube) or LCD (Liquid Crystal Display), and displays the time-series data, the transition of the translation errors, and the results of the abnormal plasma discharge, by the command of the control section 11 in accordance with the instructions that have been input from the operation 14. The screen display 15 converts the screen data displayed in the display device 7, into signals that drive the display device 7.

The print output section 16 is comprised of, a serial interface, a parallel interface, or a LAN (Local Area Network) interface, etc, which are connected with the printer device 8. The control section 11 outputs the image data to be printed by the printer device 8, through the print output section 16.

The sending/receiving section 17 is comprised of a modem or a network termination device, and a serial interfaces or a LAN (Local Area Network) interface which connects them. The control section 11 enters the time-series data from each sensor, through the sending/receiving section 17. The time-series data may be stored in other servers that are not shown in the figure. In that case, the control section 11 receives, through the sending/receiving section 17, the time-series data from the server, via a network (not shown).

Figure 3:
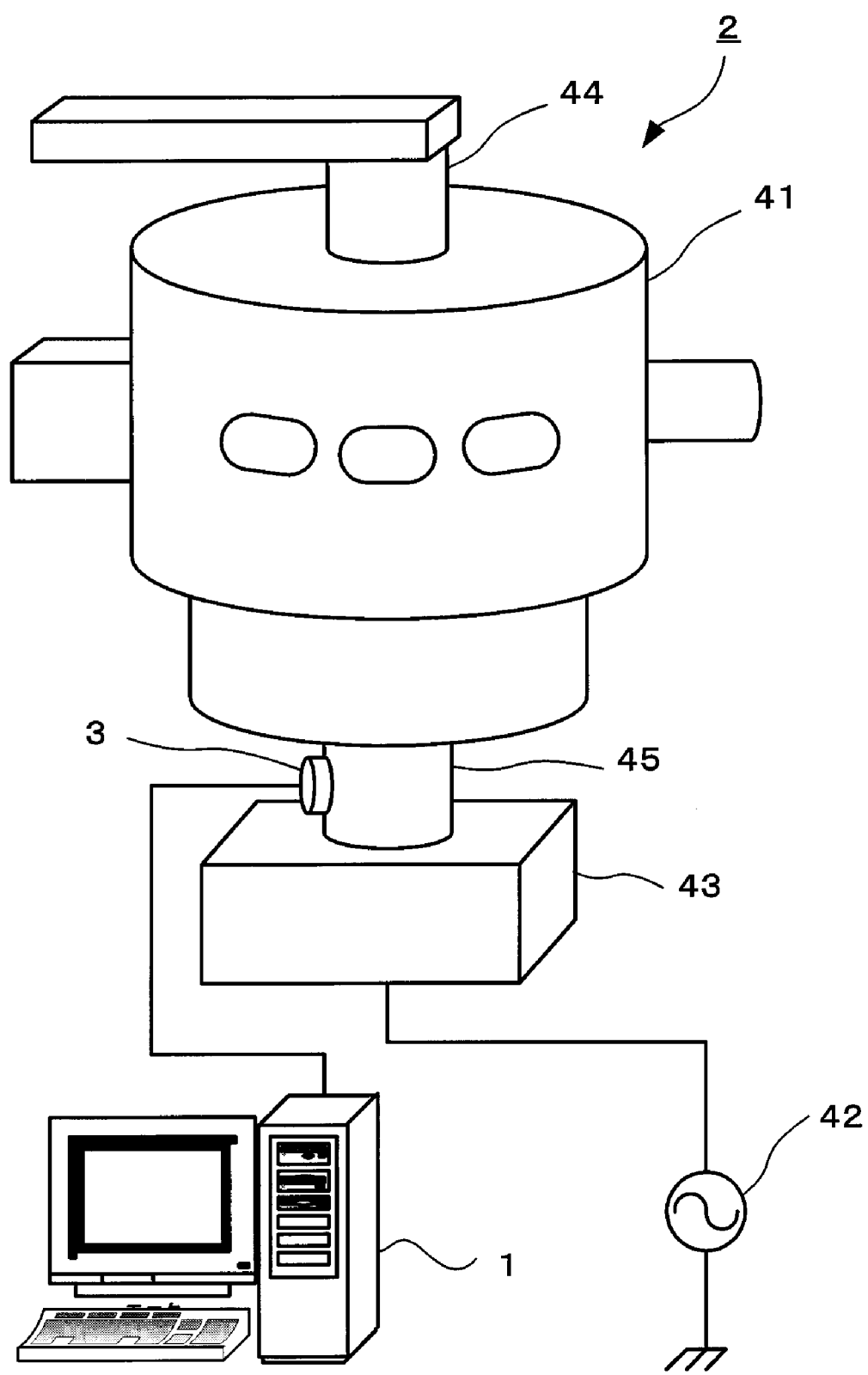
FIG. 3 is an illustration showing a configuration example of a plasma processing apparatus and an abnormal plasma discharge diagnostics system.

FIG. 3 is an illustration showing a configuration example of an abnormal plasma discharge diagnostics device 1, in the case that a plasma processing apparatus 2 is intended for a diagnosis. An AE sensor of the abnormal plasma discharge diagnostics system is mounted on the plasma processing apparatus 2. The plasma processing apparatus 2 is a kind of, for example, a semiconductor manufacturing device in which an edging process is provided to a semiconductor wafer.

The plasma processing apparatus 2 comprises a cylindrical chamber 41 made from metal, such as aluminum or stainless steel. The semiconductor wafer provided with the edging process is housed in the chamber 41. The high-frequency power source 42 is connected to a susceptor (not shown) disposed in the chamber 41, through a power-feeding rod 45 and a matching box 43. The high-frequency power source 42 supplies the high-frequency power to the susceptor. The chamber 41 is connected with a processing gas conduit (pipe) 44 extending from a processing gas supply section (not shown).

In order to provide the semiconductor wafer with a plasma edging process, the chamber 41 is depressurized to achieve almost vacuum conditions, after the semiconductor wafer is housed in the chamber. Through the processing gas conduit (pipe) 44, the processing gas (for example, mixed gas made of $C_4F_8$ gas, $O_2$ gas, and Ar gas having the given gas flow ratio) is introduced into the chamber 41 by the given gas flow rate and gas flow ratio to make the pressure inside the chamber 41, the given value. Then, if the high-frequency electricity is applied in the chamber 41, the introduced processing gas will become plasma. Radicals and ions, which are generated by the plasma, are focused on the surface of the semiconductor wafer by using a focus ring (not shown), and the surface of the semiconductor wafer is physically and chemically edged.

The AE sensor 3 is mounted on, for example, the power-feeding rod 45 (a fixing jig thereof). The abnormal plasma discharge diagnostics system 1 collects by sampling in a certain cycle, the signals entered from the AE sensor 3, and uses them as time-series data. As time-series data showing the plasma conditions, the abovementioned pressure sensor, temperature sensor, particle sensor, current sensor, voltage sensor, ultrasonic sensor, gas analyzer, vibration sensor, optical emission sensor, electromagnetic wave sensor, or plasma sensor comprised of a Langmuir probe or a plasma absorption probe, etc, is used, and the sensor is mounted on an appropriate position in the plasma processing apparatus 2. For example, the pressure sensor and the temperature sensor are mounted in the center of or in the vicinity of the plasma. Additionally, the current sensor and the voltage sensor are connected with a circuit that will generate the plasma.

Assuming that the plasma processing apparatus 2 performs a steady operation, the time-series data from the AE sensor and others are considered to be stochastic in the case of the normal conditions. Thus, when the translation error calculated from the time-series data from the AE sensor is less than or equal to a certain threshold value, it may be determined that the plasma processing apparatus 2 has caused the abnormal plasma discharge.

Next, the operations of the abnormal plasma discharge diagnostics system 1 will be described. It should be noted that, as described above, in the operations of the abnormal plasma discharge diagnostics system 1, the control section 11 performs in cooperation with, the main memory 12, the external memory 13, the operation section 14, the screen display 15, the print output section 16, and the sending/receiving section 17.

Figure 4:
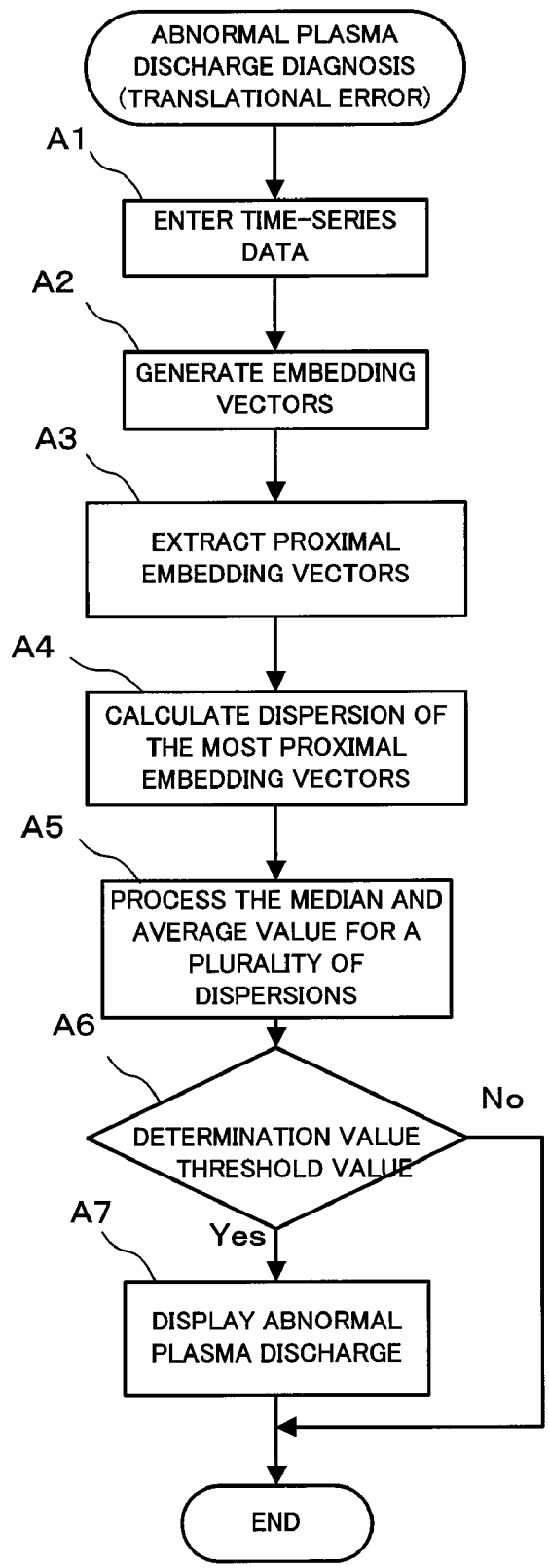
FIG. 4 is a flow chart showing an example of the operations of an abnormal plasma discharge diagnosis using a translation error.

FIG. 4 is a flow chart showing an example of the operations of an abnormal plasma discharge diagnosis using a translation error. First, the AE sensor 3 enters, into a data obtaining section 21, time-series data showing the plasma conditions intended for a diagnosis (Step A1). Referring to an example of the plasma processing apparatus 2 shown in FIG. 3, the signals entered from the AE sensor 3 are collected by sampling in a certain cycle, and will be used as the time-series data.

The embedding vector generation section 22 generates embedding vectors r (ti), from the time-series data collected by the data obtaining section 21, using the embedding dimension n and the time difference $\Delta t$ which have been set (Step A2). A neighbor vector extraction section 23 selects arbitrary embedding vectors r ($t_0$) from the set of the embedding vectors, and extracts the nearest-neighbor vectors r (tj) (j=0, . . . , K) (Step A3). The neighbor vector extraction section 23 extracts the nearest-neighbor vectors from the number M of embedding vectors that have been randomly selected, and further repeats the random selection of the number M of embedding vectors and the extraction of those nearest-neighbor vectors, for the number Q of times.

A translation error calculation section 24 calculates the translation errors, E trans for the nearest-neighbor vectors of the number M of embedding vectors that have been randomly selected, and further calculates the translation errors for the pair of the nearest-neighbor vectors of the number M of embedding vectors conducted for the number Q of times (Step A4). Then, a median value calculation/average processing section 25 calculates the median value of the translation errors, E trans for the nearest-neighbor vectors of the number M of embedding vectors, and calculates the average in the number Q of times for the median value of the pair of the number M of translation errors (Step A5).

An abnormal discharge determination section 26 determines the abnormal plasma discharge from the average value of the translation errors (Step A6). When the present determination value (the average value of the translation errors) is less than or equal to the threshold value (Step A6; Yes), the abnormal discharge determination section 26 determines that the plasma is under the abnormal discharge conditions, and a display processing section 27 displays in a display device 7 that the plasma is under the abnormal discharge conditions (Step A7). Additionally, the display processing section 27 may output for printing to a printer device 8 at the same time. If the determination value is above the threshold value (Step A6; No), the abnormal discharge determination section 26 does not determine the abnormal plasma discharge, and the display processing section 27 does not display the abnormal plasma discharge conditions. Meanwhile, in the case that the determination value tends to approach to the threshold value of the abnormal plasma discharge determination from the normal value, the display processing section 27 may display a warning that urges an inspection and maintenance.

Example 1

Figure 5:
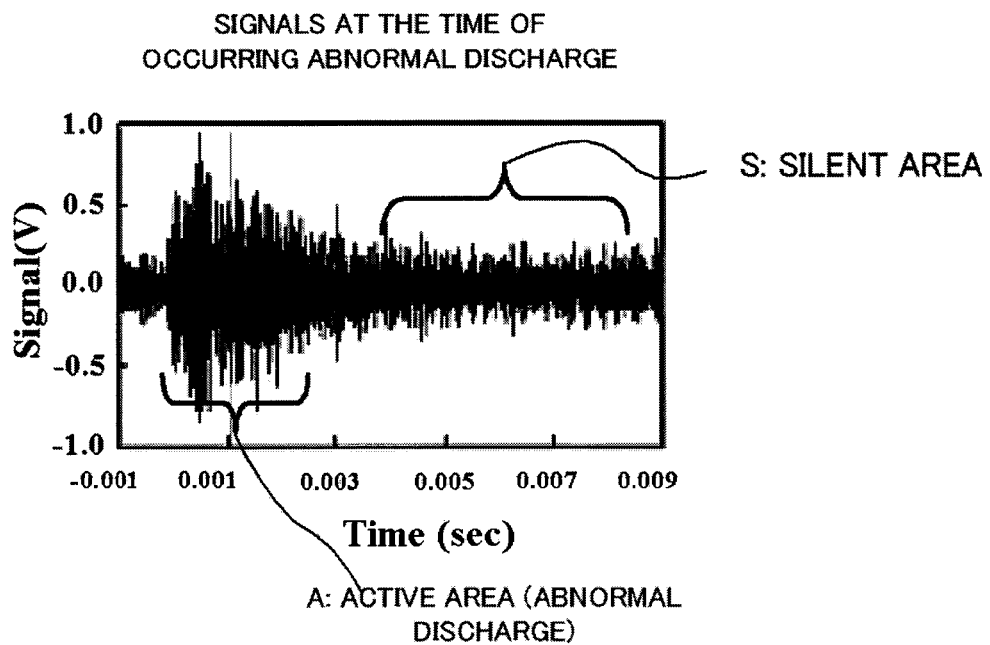
FIG. 5 is a graph showing an example of time-series data from an AE sensor of a plasma processing apparatus.

FIG. 5 is a graph showing an example of time-series data from an AE sensor of a plasma processing apparatus 2. In FIG. 5, A shows a part (active area) of the signals that is under the abnormal plasma discharge mode and S shows a part (silent area) of the signals that is under the normal conditions. For power spectrums for both the areas, the characteristic difference, for example, large or small spectrum in a certain frequency, is not seen. In the analysis of the power spectrum, it is difficult to clearly identify whether the plasma is under abnormal discharge conditions or normal conditions.

Figure 6:
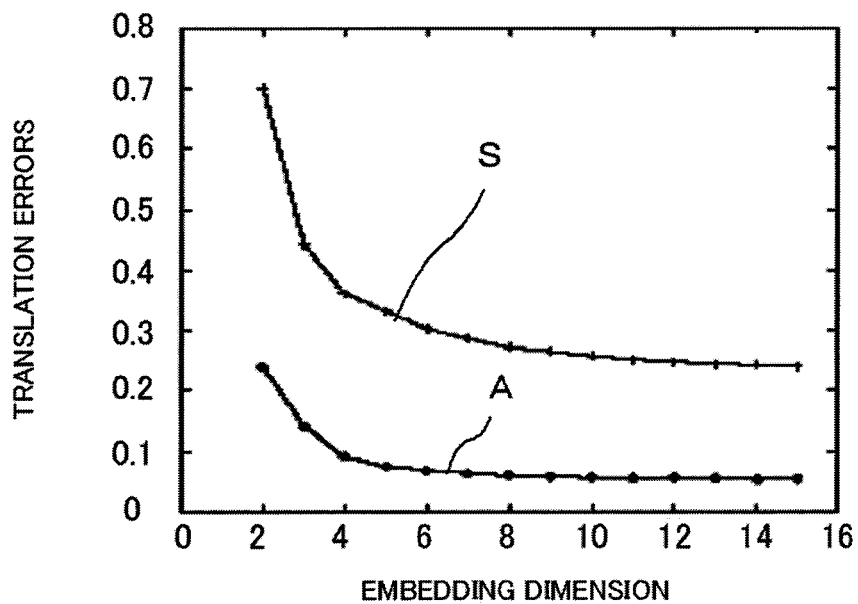
FIG. 6 is a graph showing an example of a translation error of data from an AE sensor of a plasma processing apparatus.

FIG. 6 is a graph showing an example of a translation error of data from AE sensor of a plasma processing apparatus 2. The results of calculating the translation errors for the signals from the AE sensor shown in FIG. 5 are shown in FIG. 6, having the embedding dimension and the translation error on a lateral axis and a longitudinal axis respectively. The graph A shown FIG. 6 corresponds to the signals in the part A (active area) of FIG. 5, and the graph S shown FIG. 6 corresponds to the signals in the part S (silent area) of FIG. 5. All the translation errors shown in FIG. 6 are represented by extracting 4 nearest-neighbor vectors for the embedding vectors and calculating the tracks up to the fourth proximity in a time evolution step made up of 5 steps.

In the range that the embedding dimension is less than or equal to 4, the translation error in the active area (A shown in FIG. 6) is more than or equal to 0.1; however, in the case that the embedding dimension is more than or equal to 6, the translation error in the active area is less than or equal to 0.1. If the embedding dimension is more than or equal to 6, both the active area and the silent area have nearly constant translation error, and the difference between both the areas may be clearly identified by setting the threshold value as 0.1. In the abnormal plasma discharge diagnosis using the translation error, it is appropriate that the embedding dimension is to be more than or equal to 6. Additionally, it is preferable that the translation errors are estimated in the time evolution step made up of 5 or more steps, in respect of the tracks up to the fourth or more proximity.

A method for diagnosing abnormal plasma discharge and an abnormal plasma discharge diagnostics system 1 of the present invention, make it possible to represent the difference of time-series data between the cases the plasma is under the normal conditions and under the abnormal discharge conditions, by quantifying a deterministic structure behind the time-series data and by reconstructing tracks in a phase space from the time-series data by a time-delay coordinate transformation, even though the time-series data is different, but a power spectrum is apparently the same data values. Further, the present invention can conduct a high accurate abnormal plasma discharge diagnosis by using relatively small number of data.

Embodiment 2

Figure 7:
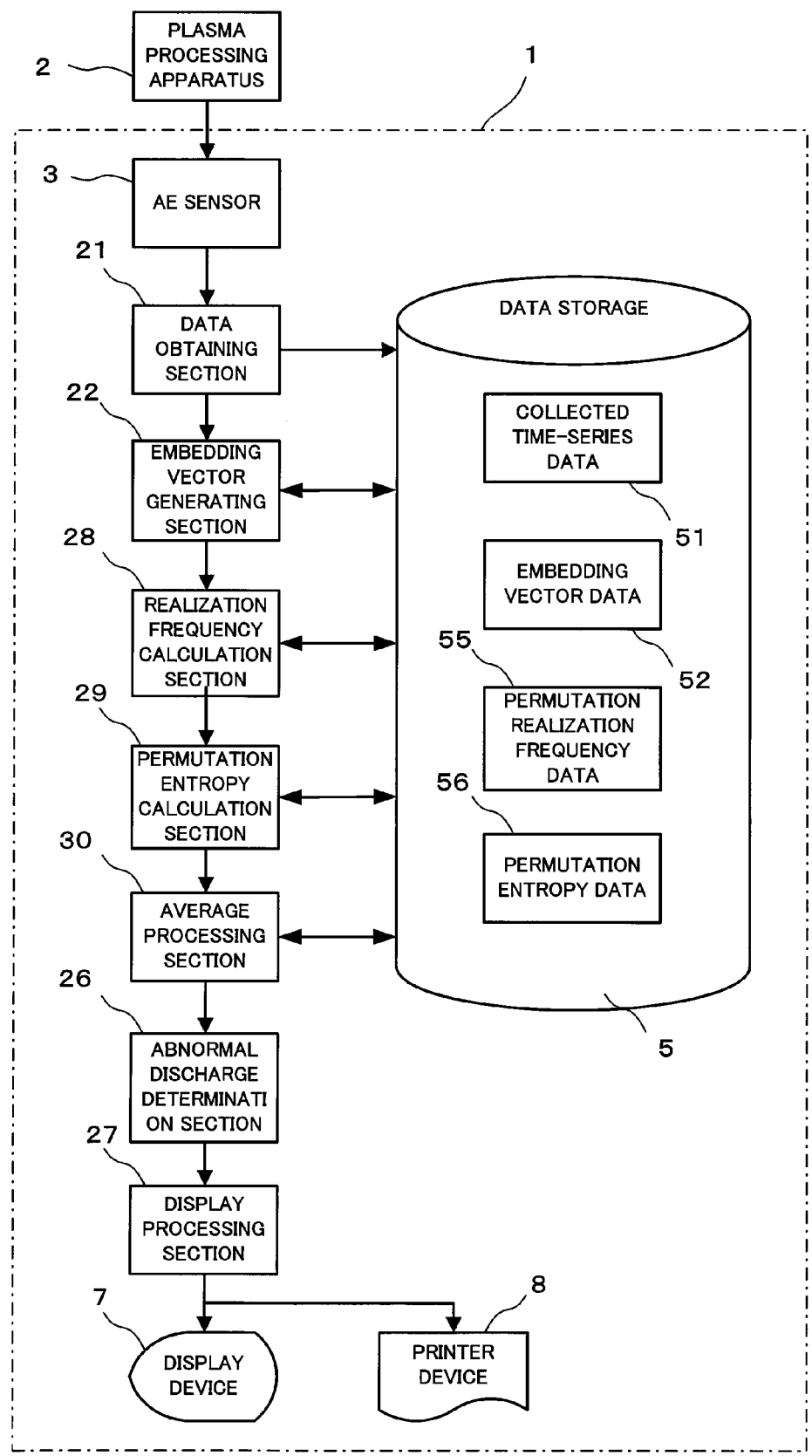
FIG. 7 is a block diagram showing a logical configuration of an abnormal plasma discharge diagnostics system, according to the second embodiment of the present invention.

Next, an abnormal plasma discharge diagnostics system 1 will be described below in the case that permutation entropy is employed as a value representing the determinism. FIG. 7 is a block diagram showing a logical configuration of an abnormal plasma discharge diagnostics system 1, according to the second embodiment of the present invention.

The abnormal plasma discharge diagnostics system 1 is comprised of an AE sensor 3, a data obtaining section 21, an embedding vector generation section 22, a realization frequency calculation section 28, a permutation entropy calculation section 29, an average processing section 30, a data storage 5, an abnormal discharge determination section 26, a display processing section 27, a display device 7, and a printer device 8. In this figure, the embedding vector generation section 22, the realization frequency calculation section 28, and the permutation entropy calculation section 29, and the average processing section 30, are combined to be a derivation section. Collected time-series data 51, embedding vector data 52, permutation realization frequency data 55, and permutation entropy data 56, which show the equipment conditions intended for the abnormal plasma discharge diagnosis, are stored in the data storage 5.

Hereinafter, the permutation entropy will be described and it will be described that it will be an indicator representing the determinism. The permutation entropy that has been introduced by Bandt and Pompe (C. Bandt and B. Pompe, Physical Review Letters, Vol. 88, pp. 174102-1-174102-4, 2002.) has asymptotically equivalent amount to the Kolmogorov-Sinai entropy in infinitely long time series, but the permutation entropy is defined as follows:

The embedding vectors r (ti) in a certain dimension n and time difference $\Delta t$, are all generated from the time-series data in the given time. For each of the embedding vectors, the element of the embedding vector has the numbering in ascending or descending order determined by the magnitude relation. The numbering arrangement in ascending or descending order is a permutation in the number of the elements. For all the embedding vectors in the given time, the number of the embedding vectors having the same ascending order or descending order is counted. The counted number is a frequency (realization frequency) that realizes the permutation that the embedding vectors have the order. The realization frequency for the number of all the embedding vectors in the dimension n and the time difference $\Delta t$ is to be a relative realization frequency. The sum of the relative realization frequency is 1. Meanwhile, the time difference Δt may be 1. In the case of Δt=1, the embedding vectors r (ti) are made up of the continuing number n of elements of the time-series data.

The order determined by the magnitude relation of the elements of the embedding vectors, is a permutation made up of the order of the number of the dimension of the embedding vectors. For the number n of embedding vectors, the set of the number n from 1 to n of the permutation is represented as Π, and the element of the set of the permutation is represented as π. When the number of the time-series data in the given time is represented as N, and the embedding dimension is represented as n, and the time difference is represented as Δt, the number of the embedding vectors generated from the time-series data in the given time is represented as N−(n−1)Δt. When the realization frequency of a certain permutation is represented as m (π), the relative realization frequency p (π) of a certain permutation π is represented by the following formula (4):

[Equation 2]

$$p(\pi) = \frac{m(\pi)}{N - (n-1)\Delta t} \quad (4)$$

The relative realization frequency p (π) is equal to classifying by pattern by performing a coarse gaining of the complexities of the time fluctuation. The complexities of original time-series (determinism) may be quantitatively assessed by regarding the relative realization frequency p (π) as the realization probability of the permutation π, and calculating the information entropy. A permutation entropy defined as the permutation π in the number of the dimension of the embedding vectors is to be a stochastic variable, and the relative realization frequency p (π) is to be a stochastic distribution. The permutation entropy is defined by the following formula (5).

[Equation 3]

$$H(n) = -\sum_{\pi \in \Pi} p(\pi) \log_2 p(\pi) \quad (5)$$

However, the term of p(π)=0 is not included.

The permutation entropy may quantitatively assess the complexities of original time-series (determinism). The simplest behavior is a monotonous process. The permutation entropy is minimum in the monotonous increasing process and the monotonous decreasing process. Meanwhile, the most complex behavior is a full random process. In this case, the permutation entropy will be the maximum, since all the possible patterns are realized.

π is a permutation of the embedding dimension n, and the permutation set Π that includes the number n! of the elements (permutation), is represented by $0 \leq H(n) \leq \log_2 n!$, based on the definition of the formula (5). The minimum corresponds to the monotonous increasing process or the monotonous decreasing process. The maximum represents the full random process.

Bandt and Pompe focused that H (n) linearly increases against n to introduce the amount that is defined by the following formula (6).

[Equation 4]

$$h(n) = \frac{H(n)}{n-1} \quad (6)$$

It is convenient if h (n) is normalized by $\log_2 n!$ and the entropy defined by the following formula (7) is used.

[Equation 5]

$$h*(n) = \frac{h(n)}{\log_2 n!} \quad (7)$$

$0 \leq h*(n) \leq 1$ has equality. As the deterministic aspect of the time-series data increases, h*(n) will approach 0. If the time-series data is a white noise, h*(n) will be proximal to 1.

This embodiment diagnoses the abnormal plasma discharge, using the fact that the permutation entropy H (n), or h*(n) that normalizes H (n), become an indicator representing the determinism of the time-series data showing the conditions of the plasma that is intended for the diagnosis. The time-series data from the AE sensor under the normal plasma conditions, irregularly fluctuates in accordance with various disturbances, which is considered to be stochastic. In the case that the plasma is under the abnormal discharge conditions, the time-series data is considered to be deterministic, since the acoustic emission is controlled by the abnormal discharge. Thus, when the permutation entropy is less than or equal to a given threshold value, it is determined that the plasma is under the abnormal discharge conditions.

Returning to FIG. 7, the function of each section in the abnormal plasma discharge diagnostics system 1, will be described. The data obtaining section 21 collects the time-series data showing the conditions of the equipment intended for the diagnosis, and the data is memorized as collected time-series data 51 in a data storage 5. Examples of time-series data, other than the data from an AE sensor, include data from a pressure sensor, a temperature sensor, a particle sensor, a current sensor, a voltage sensor, an ultrasonic sensor, a gas analyzer, a vibration sensor, an optical emission sensor, an electromagnetic wave sensor, or a plasma sensor, etc. A plasma sensor is comprised of, for example, a Langmuir probe or a plasma absorption probe. It is possible that the value detected by theses sensors will vary when the plasma is under the abnormal discharge conditions. The time-series data showing the plasma conditions are entered from various sensors (not shown) by sampling in an appropriate cycle.

The embedding vector generation section 22 generates the above-mentioned embedding vector r (ti), from the collected time-series data 51. The dimension n and the time difference Δt of the embedding vector, are predetermined according to the characteristics of the time-series data. The embedding vector generation section 22 enables the set of the generated embedding vectors to be memorized in the data storage 5 (embedding vector data 52).

The realization frequency calculation section 28 performs an ordering of the elements in accordance with the magnitude relation, and counts the number of embedding vectors having the same order in respect of all the embedding vectors in the given time. The realization frequency calculation section 28 enables the counted realization frequency of the permutation to be memorized in the data storage 5 (permutation realization frequency data 55).

The permutation entropy calculation section 29 converts the permutation realization frequency data 55 into the relative realization frequency, and calculates the permutation entropy. Further, the permutation entropy calculation section 29 calculates h* (n) shown in the formula (7). The permutation entropy calculation section 29 enables the permutation entropy H (n) or h* (n) to be memorized in the data storage 5 (permutation entropy data 56).

The average processing section 30 averages the permutation entropy H (n) or h* (n) that have been calculated from a plurality of the time-series data in the given time. It may be a moving average of the permutation entropy H (n) or h* (n). In the case that the time-series data in the given time is long enough, the average processing may not be performed.

The average value of the permutation entropy H (n) or h* (n) is entered in the abnormal discharge determination section 26. In the abnormal discharge determination section 26, the average value of the permutation entropy H (n) or h* (n) is compared with the given threshold value, and if the average value of the permutation entropy H (n) or h* (n) is less than or equal to the threshold value, it will be determined that the plasma is under abnormal discharge conditions.

A display processing section 27 displays in a display device 7, for example, the average value transition of the permutation entropy H (n) or h* (n), and the determination results of the abnormal plasma discharge. The display processing section 27 also enables the printer device 8 to output for printing at the same time. The display processing section 27 may display the time-series data together with the permutation entropy H (n) or h* (n). If it is determined that the plasma is under abnormal discharge conditions, the display processing section 27 may display a warning by means of blinking a light or ringing a buzzer.

In Embodiment 2, the physical configuration of the abnormal plasma discharge diagnostics system 1 is the same as Embodiment 1. The abnormal plasma discharge diagnostics system 1 can be shown, for example, in the block diagram of the physical configuration in FIG. 2. The data obtaining section 21, the embedding vector generation section 22, the realization frequency calculation section 28, the permutation entropy calculation section 29, the average processing section 30, the abnormal discharge determination section 26, and the display processing section 27, can be realized by the control section 11 and the programs executed thereon.

For the abnormal plasma discharge diagnostics system 1 according to the Embodiment 2, in the case that the plasma processing apparatus 2 shown in FIG. 3 is intended for a diagnosis, the configuration of the abnormal plasma discharge diagnostics system 1 is shown. The AE sensor 3 detecting the acoustic emission of the plasma processing apparatus 2 is mounted on the abnormal plasma discharge diagnostics system 1. The abnormal plasma discharge diagnostics system 1 collects the signals entered from the AE sensor 3 by sampling in a certain cycle, and uses them as the time-series data.

Assuming that the plasma processing apparatus 2 performs a steady operation, the time-series data from the AE sensor 3 are considered to be stochastic in the case of the normal conditions. Thus, when the permutation entropy calculated from the time-series data of the acoustic signals is less than or equal to a certain threshold value, it may be determined that the plasma is under the abnormal plasma discharge conditions.

Next, the operations of the abnormal plasma discharge diagnostics system 1 will be described. It should be noted that, as described above, in the operations of the abnormal plasma discharge diagnostics system 1, the control section 11 performs in cooperation with the main memory 12, the external memory 13, the operation section 14, the screen display 15, the print output section 16, and the sending/receiving section 17.

Figure 8:
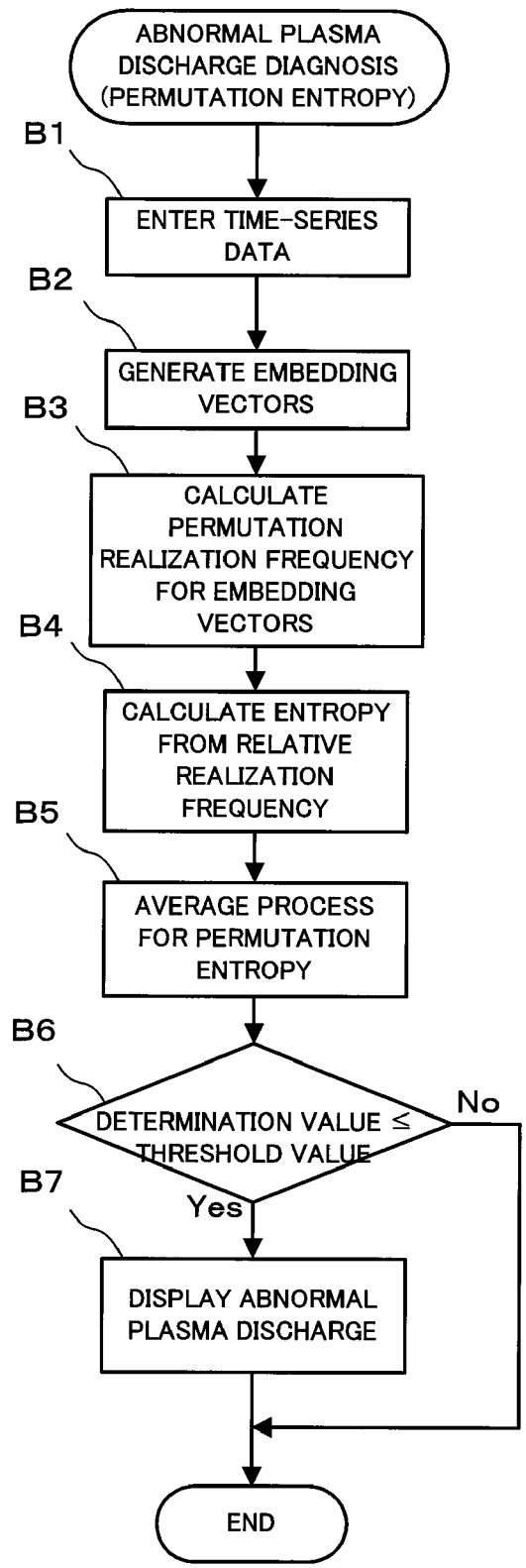
FIG. 8 is a flow chart showing an example of the operations of an abnormal plasma discharge diagnostics using permutation entropy.

FIG. 8 is a flow chart showing an example of the operations of an abnormal plasma discharge diagnosis using permutation entropy. First, the AE sensor 3 enters, into the data obtaining section 21, time-series data showing the plasma conditions intended for a diagnosis (Step B1). Referring to an example of the plasma processing apparatus 2 shown in FIG. 3, the acoustic signals entered from the AE sensor 3 is collected by sampling in a certain cycle, and will be used as the time-series data.

The embedding vector generation section 22 generates embedding vectors r (t), from the time-series data collected by the data obtaining section 21, using the embedding dimension n and the time difference $\Delta t$ which have been predetermined (Step B2). The realization frequency calculation section 28 performs an ordering of the elements in accordance with the magnitude relation, and counts, as the realization frequency, the number of the embedding vectors having the same order in respect of all the embedding vectors in the given time (Step B3).

The permutation entropy calculation section 29 converts the permutation realization frequency into the relative realization frequency, and calculates the permutation entropy (Step B4). Further, the permutation entropy calculation section 29 calculates h* (n) shown in the formula (7). Then, the average processing section 30 averages the permutation entropy H (n) or h* (n) that have been calculated from a plurality of the time-series data in given time (Step B5). As described above, the average process may be omitted.

An abnormal discharge determination section 26 determines the abnormal plasma discharge from the average value of the permutation entropy H (n) or h* (n) (Step B6). When the present determination value (the average value of translation errors) is less than or equal to the threshold value (Step B6; Yes), the abnormal discharge determination section 26 determines that the plasma is under abnormal discharge conditions, and a display processing section 27 displays in a display device 7 that the plasma is under abnormal discharge conditions (Step B7). Additionally, the display processing section 27 may output for printing to a printer device 8 at the same time. If the determination value is above the threshold value (Step B6; No), the abnormal discharge determination section 26 does not determine the abnormal plasma discharge, and the display processing section 27 may not display the abnormal plasma discharge conditions. Meanwhile, in the case that the determination value tends to approach the threshold value of the abnormal plasma discharge determination from the normal value, the display processing section 27 may display a warning that urges an inspection and maintenance.

Example 2

Figure 9:
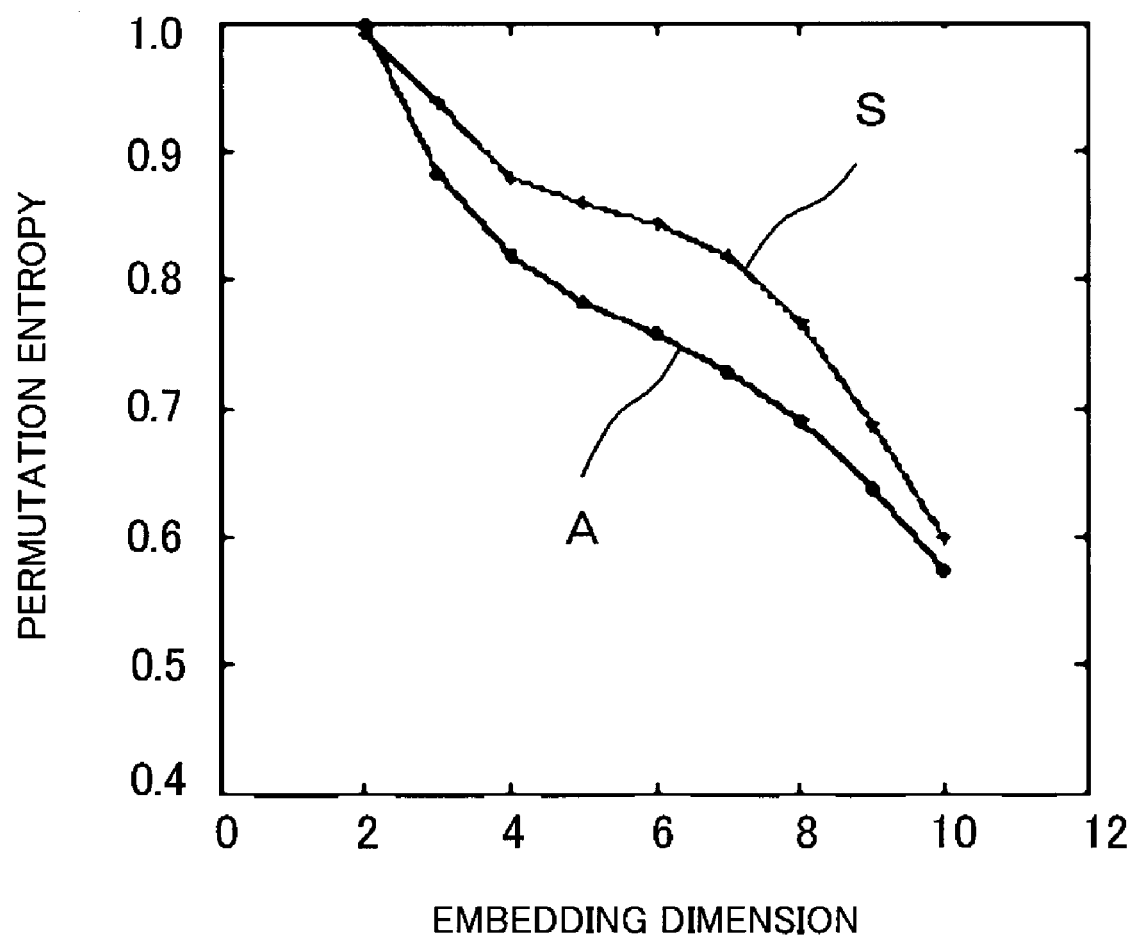
FIG. 9 is a graph showing an example of permutation entropy of data from AE sensor of a plasma processing apparatus.

FIG. 9 is a graph showing an example of the permutation entropy of data from AE sensor of a plasma processing apparatus 2. The results of calculating the permutation entropy for the signals from the AE sensor shown in FIG. 5, are shown in FIG. 9, having the embedding dimension and the normalized permutation entropy h* (n) on a lateral axis and a longitudinal axis respectively. The graph A shown in FIG. 9 is normalized permutation entropy h* (n) that corresponds to the signals in the part A (active area) of FIG. 5, and the graph S shown FIG. 9 is normalized permutation entropy h* (n) that corresponds to the signals in the part S (silent area) of FIG. 5.

In the range that the embedding dimension is small, the difference between A and S is small, but in the case that the embedding dimension is in the range from 4 to 8, the difference between A and S is apparent. By setting an appropriate threshold value, it is determined that, the plasma conditions are normal if the permutation entropy H (n) or h* (n) is above the threshold value, and the plasma is under abnormal discharge conditions if the permutation entropy H (n) or h* (n) is less than or equal to the threshold value. In this example, it is preferable that the embedding dimension be 6 or 7. In that case, if the permutation entropy is less than or equal to 0.8, it may be determined that the plasma is under abnormal discharge conditions.

FIG. 9 shows that the difference between A and S and both the values, are smaller in the range more than or equal to 9, since the embedding dimension is large relative to the time-series data in the given time and the number of the embedding vectors is not enough. In the case that the embedding dimension or the time difference is large, the number of the generated embedding vectors will be relatively small, and the number (n!) of the permutation that may be generated will be large, so it is necessary that the number of the time-series data is large by taking a long time for the given time.

A method for diagnosing abnormal plasma discharge and an abnormal plasma discharge diagnostics system 1 of the present invention, make it possible to represent the difference of time-series data between the cases of the plasma under normal conditions and under abnormal discharge conditions, by quantifying a deterministic structure behind the time-series data and by reconstructing tracks in a phase space from the time-series data by a time-delay coordinate transformation, even though the time-series data is different, but a power spectrum has apparently the same data values. Further, the present invention can conduct a high accurate abnormal plasma discharge diagnosis by using relatively small number of data.

As described above, an abnormal plasma discharge diagnostics system 1 according to the present invention, for example, as with a plasma processing apparatus 2 shown in FIG. 3, can perform an abnormal discharge diagnosis by entering and analyzing the time-series data from the output of one AE sensor 3. Additionally the present invention can perform an abnormal plasma discharge diagnosis under the operating state of the equipment.

For others, the such hardware configuration is described by way of an example, therefore alternations and modifications can be arbitrarily made.

The principal section that performs the abnormal plasma discharge diagnostics process, which is comprised of the control section 11, the main memory 12, the external memory 13, the operation section 14, the screen display 15, the print output section 16, the sending/receiving section 17, and the internal bus 10, etc, can be realized by a normal computer system, not by a special system. For example, the abnormal plasma discharge diagnostics system 1 that executes the such operation may be configured by storing in a computer-readable recording memory (flexible disc, CD-ROM, DVD-ROM, etc.), a computer program for executing the operation in order to distribute, and by installing the relevant computer program into a computer. Additionally, the abnormal plasma discharge diagnostics system 1 may be configured by storing the relevant computer program in a recording memory provided in a server device on a communication network such as the Internet so that a normal computer system can download it.

In the case that the functions of the abnormal plasma discharge diagnostics system 1 are realized by sharing application programs and OS (operating system) or by cooperating between OS and application programs, only the part of the application programs may be stored in a recording media and a recording device.

Additionally, it is also possible to distribute via a communication network by superposing a computer program on a carrier. For example, the such computer program may be distributed via a network by posting the such computer program on the board (BBS, Bulletin Board System) provided on the communication network. Then, it may be configured to execute the such process by running this computer program and executing in the same way as other application programs.

The embodiments disclosed herein are to be considered in all respects as illustrative and not restrictive. It is intended that the scope of the present invention is not indicated by the abovementioned description but by claims, and all alternations made within the equivalent meaning and the scope specified in the claim, are included.

The present application is based on the Japanese Patent Application No. 2006-183886 filed on Jul. 3, 2006. The application, claims, and figures of the Japanese Patent Application No 2006-183886 will be incorporated entirely herein by reference.

INDUSTRIAL APPLICABILITY

The present invention provides a highly accurate method of diagnosing abnormal plasma discharge and abnormal plasma discharge diagnostics system, without the need to comprise multiple sensors in a plasma processing apparatus.

The invention claimed is:

1. A method for diagnosing abnormal plasma discharge, comprising:
a data obtaining step adapted to cause a data obtaining section to obtain a time-series data that fluctuates in accordance with the plasma conditions;
a determinism condition assessment step adapted to cause a derivation section to derive a value representing a determinism condition for providing an indicator of whether the time-series data in the plasma is deterministic or stochastic, from the time-series data that have been obtained in the data obtaining step; and
an abnormal discharge determination step adapted to cause an abnormal discharge determination section to determine that the plasma is under the abnormal discharge conditions, if the value representing the determinism condition derived in the determinism condition assessment step is less than or equal to a given threshold value, during the plasma generation;
wherein the value representing the determinism condition includes at least one of a translation error that is calculated from the time-series data and a permutation entropy that is calculated from the time series data.

2. The method according to claim 1, wherein:
the value representing the determinism condition is a translation error that is calculated from the time-series data, and the determinism condition assessment step includes:
an embedding step adapted to cause an embedding vector generation section to calculate embedding vectors having a certain dimension from the time-series data;
a nearest-neighbor vector extraction step adapted to cause a neighbor vector extraction section to extract a given number of the nearest-neighbor vectors in respect of a certain embedding vector, out of the embedding vectors that have been calculated in the embedding step; and a translation error calculation step adapted to cause a translation error calculation section to calculate a translation error that is the dispersion of a given number of nearest-neighbor vectors that have been extracted in the nearest-neighbor vector extraction step, and in the abnormal discharge determination step, the abnormal discharge determination section to determine that the plasma is under the abnormal discharge conditions, if the translation error calculated in the translation error calculation step is less than or equal to the given threshold value, during the plasma generation.

3. The method according to claim 1, wherein:
the value representing the determinism condition is permutation entropy that is calculated from the time-series data, and
the determinism condition assessment step includes:
an embedding step adapted to cause an embedding vector generation section to calculate embedding vectors having a certain dimension from the time-series data;
a realization frequency calculation step adapted to cause, in respect of all the embedding vectors calculated from the time-series data in the given time that have been calculated in the embedding step, a realization frequency calculation section to accumulate the frequency having the same order determined by a magnitude relation for elements of the embedding vectors, and calculates a relative realization frequency against the number of all the embedding vectors calculated from the time-series data in the given time; and
a permutation entropy calculation step adapted to cause a permutation entropy calculation section to calculate permutation entropy which is defined that all the permutation made up of the same number of orders as the number of the dimensions of the embedding vector are to be a stochastic variable, and that the relative realization frequency calculated in the realization frequency calculation step is to be a stochastic distribution,
and in the abnormal discharge determination step, the abnormal discharge determination section determines that the plasma is under the abnormal discharge conditions, if the permutation entropy calculated in the permutation entropy calculation step is less than or equal to the given threshold value, during the plasma generation.

4. The method according to claim 1, wherein the time-series data fluctuating in accordance with the plasma conditions includes at least one of the time-series data from an AE (Acoustic Emission) sensor, a pressure sensor, a temperature sensor, a particle sensor, a current sensor, a voltage sensor, an ultrasonic sensor, a gas analyzer, a vibration sensor, an optical emission sensor, an electromagnetic wave sensor, or a plasma sensor comprised of a Langmuir probe or a plasma absorption probe.

5. The method according to claim 2, wherein the dimension of the embedding vector is more than or equal to 6.

6. The method according to claim 5, wherein:
the nearest-neighbor vector extraction step extracts more than or equal to 4 nearest-neighbor vectors in respect of the certain embedding vector;
the translation error calculation step calculates a translation error estimated in a time evolution step made up of 5 steps, in respect of tracks up to the fourth proximity; and
the abnormal discharge determination step determines that the plasma is under the abnormal discharge conditions, if the translation error estimated in the time evolution step made up of 5 steps is less than or equal to 0.1, in respect of the tracks up to the fourth proximity and during plasma generation.

7. The method according to claim 3, wherein:
the permutation entropy calculation step calculates permutation entropy that is normalized such that the permutation entropy under a full random process is an upper value; and
the abnormal discharge determination step determines that the plasma is under the abnormal discharge conditions, if the normalized permutation entropy is less than or equal to 0.8, and during plasma generation.

8. An abnormal plasma discharge diagnostics system, comprising:
a data obtaining unit adapted to cause a data obtaining section to obtain a time-series data that fluctuates in accordance with the plasma conditions;
a determinism condition assessment unit adapted to cause a derivation section to derive a value representing a determinism condition for providing an indicator of whether the time-series data in the plasma is deterministic or stochastic, from the time-series data that have been obtained in the data obtaining unit; and
an abnormal discharge determination unit adapted to cause an abnormal discharge determination section to determine that the plasma is under the abnormal discharge conditions, if the value representing the determinism condition derived in the determinism condition assessment unit is less than or equal to a given threshold value, during the plasma generation;
wherein the value representing the determinism condition includes at least one of a translation error that is calculated from the time-series data and a permutation entropy that is calculated from the time series data.

9. The abnormal plasma discharge diagnostics system according to claim 8, wherein:
the value representing the determinism condition is a translation error that is calculated from the time-series data, and
the determinism condition assessment unit comprises:
an embedding unit adapted to cause an embedding vector generation section to calculate embedding vectors having a certain dimension from the time-series data;
a nearest-neighbor vector extraction unit adapted to cause a neighbor vector extraction section to extract a given number of the nearest-neighbor vectors in respect of a certain embedding vector, out of the embedding vectors that have been calculated in the embedding unit; and
a translation error calculation unit adapted to cause a translation error calculation section to calculate a translation error that is the dispersion of a given number of nearest-neighbor vectors that have been extracted in the nearest-neighbor vector extraction unit,
wherein the abnormal discharge determination unit determines that the plasma is under abnormal discharge conditions, if the translation error calculated in the translation error calculation unit is less than or equal to the given threshold value, during plasma generation.

10. The abnormal plasma discharge diagnostics system according to claim 8, wherein:
the value representing the determinism condition is permutation entropy that is calculated from the time-series data, and
the determinism condition assessment unit comprises: an embedding unit adapted to cause the embedding vector generation section to calculate embedding vectors having a certain dimension from the time-series data;

a realization frequency calculation unit adapted to cause, in respect of all the embedding vectors calculated from the time-series data in the given time that have been calculated in the embedding unit, a realization frequency calculation section to accumulate the frequency having the same order determined by a magnitude relation for elements of the embedding vectors, and calculates a relative realization frequency against the number of all the embedding vectors calculated from the time-series data in the given time; and a permutation entropy calculation unit adapted to cause a permutation entropy calculation section to calculate permutation entropy, in which all the permutation made up of the same number of orders as the number of the dimensions of the embedding vectors are to be a stochastic variable, and the relative realization frequency calculated in the realization frequency calculation unit is to be a stochastic distribution, wherein the abnormal discharge determination unit determines that the plasma is under abnormal discharge conditions, if the permutation entropy calculated in the permutation entropy calculation unit is less than or equal to the given threshold value, during plasma generation.

11. The abnormal plasma discharge diagnostics system according to claim 8, wherein the time-series data fluctuating in accordance with the plasma conditions includes at least one of the time-series data from an AE (Acoustic Emission) sensor, a pressure sensor, a temperature sensor, a particle sensor, a current sensor, a voltage sensor, an ultrasonic sensor, a gas analyzer, a vibration sensor, an optical emission sensor, an electromagnetic wave sensor, or a plasma sensor comprised of a Langmuir probe or a plasma absorption probe.

12. The abnormal plasma discharge diagnostics system according to claim 9, wherein the dimension of the embedding vector is more than or equal to 6.

13. The abnormal plasma discharge diagnostics system according to claim 12, wherein:

the nearest-neighbor vector extraction unit extracts more than or equal to 4 nearest-neighbor vectors, in respect of the certain embedding vector;

the translation error calculation unit calculates a translation error estimated in a time evolution step made up of 5 steps in respect of tracks up to the fourth proximity;

and the abnormal discharge determination step determines that the plasma is under the abnormal conditions, if the translation error estimated in the time evolution step made up of 5 steps is less than or equal to 0.1, in respect of the tracks up to the fourth proximity and during plasma generation.

14. The abnormal plasma discharge diagnostics system according to claim 10, wherein:

the permutation entropy calculation unit calculates permutation entropy that is normalized such that the permutation entropy under a full random process is an upper value; and the abnormal discharge determination unit determines that the plasma is under the abnormal discharge conditions, if the normalized permutation entropy is less than or equal to 0.8, and during plasma generation.

15. A non-transitory computer readable media for causing a computer to function as the following units in order to diagnose abnormal plasma discharge:

a data obtaining unit adapted to cause a data obtaining section to obtain a time-series data that fluctuates in accordance with the plasma conditions;

a determinism condition assessment unit adapted to cause a derivation section to derive a value representing a determinism condition for providing an indicator of whether the time-series data in the plasma is deterministic or stochastic, from the time-series data that have been obtained in the data obtaining unit; and an abnormal discharge determination unit adapted to cause an abnormal discharge determination section to determine that the plasma is under the abnormal discharge conditions, if the value representing the determinism condition derived in the determinism condition assessment unit is less than or equal to a given threshold value, during plasma generation;

wherein the value representing the determinism condition includes at least one of a translation error that is calculated from the time-series data and a permutation entropy that is calculated from the time series data.

* * * * *